(12) United States Patent
Yamashita et al.

(10) Patent No.: US 10,192,768 B2
(45) Date of Patent: Jan. 29, 2019

(54) SHEET FOR SEMICONDUCTOR PROCESSING

(71) Applicant: LINTEC CORPORATION, Tokyo (JP)

(72) Inventors: Shigeyuki Yamashita, Tokyo (JP); Akinori Sato, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 14/914,358

(22) PCT Filed: Aug. 29, 2014

(86) PCT No.: PCT/JP2014/072765
§ 371 (c)(1),
(2) Date: Feb. 25, 2016

(87) PCT Pub. No.: WO2015/030186
PCT Pub. Date: Mar. 5, 2015

(65) Prior Publication Data
US 2016/0211163 A1    Jul. 21, 2016

(30) Foreign Application Priority Data

Aug. 30, 2013   (JP) .................................. 2013-180097

(51) Int. Cl.
*C09J 9/02* (2006.01)
*C09J 133/14* (2006.01)
(Continued)

(52) U.S. Cl.
CPC ........ *H01L 21/6836* (2013.01); *C08K 5/0075* (2013.01); *C09J 7/385* (2018.01);
(Continued)

(58) Field of Classification Search
None
See application file for complete search history.

(56) References Cited

U.S. PATENT DOCUMENTS

2003/0114560 A1   6/2003   Yang et al.
2011/0256394 A1  10/2011   Nishio
(Continued)

FOREIGN PATENT DOCUMENTS

JP   H08-027239 A   1/1996
JP   2000-183140 A  6/2000
(Continued)

OTHER PUBLICATIONS

Human translation of KR 20020047702 A (2002).*
(Continued)

*Primary Examiner* — Frank D Ducheneaux
(74) *Attorney, Agent, or Firm* — Posz Law Group, PLC

(57) ABSTRACT

A semiconductor processing sheet, the sheet comprising a base material and a pressure sensitive adhesive layer laminated on at least one surface of the base material, the pressure sensitive adhesive layer being formed of a pressure sensitive adhesive composition, the pressure sensitive adhesive composition containing a polymer having a salt and an energy ray curable group and an energy ray curable pressure sensitive adhesive component (excluding the above polymer). The semiconductor processing sheet can suppress contamination of an adherent at the time of peeling after energy ray irradiation while exhibiting a sufficient antistatic property.

9 Claims, 1 Drawing Sheet

(51) Int. Cl.
*C09J 7/38* (2018.01)
*C09J 133/08* (2006.01)
*C08L 33/08* (2006.01)
*C09J 175/16* (2006.01)
*C08L 33/14* (2006.01)
*C08L 75/16* (2006.01)
*H01L 21/683* (2006.01)
*C08K 5/00* (2006.01)

(52) U.S. Cl.
CPC ............. *C09J 9/02* (2013.01); *C09J 133/14* (2013.01); *C08K 5/0025* (2013.01); *C08L 2312/06* (2013.01); *C09J 2201/122* (2013.01); *C09J 2201/606* (2013.01); *C09J 2203/326* (2013.01); *C09J 2205/102* (2013.01); *C09J 2205/31* (2013.01); *C09J 2433/00* (2013.01); *H01L 2221/6834* (2013.01); *H01L 2221/68327* (2013.01); *H01L 2221/68336* (2013.01); *H01L 2221/68381* (2013.01); *H01L 2221/68386* (2013.01)

(56) References Cited

U.S. PATENT DOCUMENTS

| | | |
|---|---|---|
| 2013/0133938 A1 | 5/2013 | Sato et al. |
| 2014/0011022 A1 | 1/2014 | Ukei et al. |
| 2014/0162434 A1* | 6/2014 | Shiga .................. H01L 23/544 438/464 |

FOREIGN PATENT DOCUMENTS

| | | |
|---|---|---|
| JP | 2003-105292 A | 4/2003 |
| JP | 2003-226866 A | 8/2003 |
| JP | 2004-536940 A | 12/2004 |
| JP | 2010-106283 A | 5/2010 |
| JP | 2010-232422 A | 10/2010 |
| JP | 2011-012195 A | 1/2011 |
| JP | 2011-224853 A | 11/2011 |
| JP | 2011-236266 A | 11/2011 |
| JP | 2012-207110 A | 10/2012 |
| JP | 2013-098408 A | 5/2013 |
| JP | 2014-135469 A | 7/2014 |
| KR | 2002-0047702 A | 6/2002 |
| KR | 10-2007-0115213 A | 12/2007 |

OTHER PUBLICATIONS

Extended European Search Report dated Feb. 28, 2017 issued in the corresponding EP application No. 14838994.3.

International Search Report of the International Searching Authority dated Nov. 18, 2014 for the corresponding international application No. PCT/JP2014/072765 (and English translation).

Office Action dated Jan. 23, 2018 issued in corresponding JP patent application No. 2015-534335.

\* cited by examiner

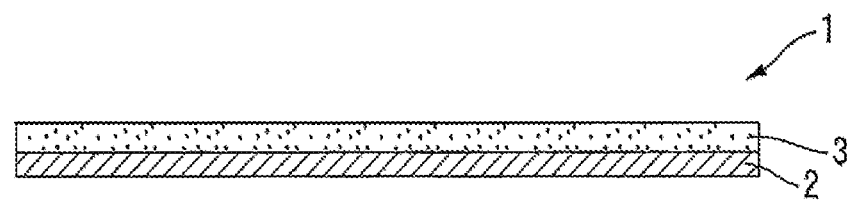

SHEET FOR SEMICONDUCTOR PROCESSING

CROSS REFERENCE TO RELATED APPLICATIONS

This application is a U.S. national stage application of PCT/JP2014/072765 filed on Aug. 29, 2014, which claims priority to Japanese Patent Application No. 2013-180097 filed on Aug. 30, 2013, the contents of which are incorporated herein by reference.

TECHNICAL FIELD

The present invention relates to a sheet for semiconductor processing.

BACKGROUND ART

In a step of grinding and/or cutting a semiconductor wafer, a pressure sensitive adhesive sheet is used for the purpose of fixing the semiconductor wafer and protecting circuits and the like. As such a pressure sensitive adhesive sheet, there is a pressure sensitive adhesive sheet that comprises an energy ray curable pressure sensitive adhesive layer and has a strong adhesive strength during processing steps after attaching a semiconductor wafer thereto while the adhesive strength is reduced by irradiation of an energy ray when the pressure sensitive adhesive sheet is peeled off.

Such a pressure sensitive adhesive sheet is peeled off after predetermined processing steps are completed, but at the time of peeling, a static electrical charge called "peeling charge" may be generated between the pressure sensitive adhesive sheet and an adherend such as a semiconductor wafer and semiconductor chips (which may be simply referred to as a "chip" or "chips" hereinafter). Such a static electrical charge may cause breakage of semiconductor wafer/chips and circuits formed thereon. To prevent this, in a pressure sensitive adhesive sheet used when processing a semiconductor wafer, a quaternary ammonium salt compound having a low molecular weight is known to be added to a pressure sensitive adhesive thereby to allow the pressure sensitive adhesive sheet to have an antistatic property.

When a quaternary ammonium salt compound having a low molecular weight is used as an antistatic agent, however, problems may occur in that the compound bleeds out from the pressure sensitive adhesive sheet and the residual substances (particles) of the pressure sensitive adhesive contaminate the surface of an adherend such as a semiconductor wafer and chips.

In relation to the above, an antistatic pressure sensitive adhesive for an optical member is proposed as a pressure sensitive adhesive having an antistatic property, which uses as the pressure sensitive adhesive component a (meth) acrylic-based copolymer having a quaternary ammonium salt (see Patent Literature 1). In this pressure sensitive adhesive, the quaternary ammonium salt is introduced into the (meth)acrylic-based copolymer to allow a high molecular weight.

PRIOR ART LITERATURE

Patent Literature

[Patent Literature 1] JP2011-12195A

SUMMARY OF THE INVENTION

Problems to be Solved by the Invention

However, the pressure sensitive adhesive disclosed in Patent Literature 1 is used for a pressure sensitive adhesive sheet to be attached to an optical member such as a polarization plate, and peeling via energy ray irradiation may not be expected. Therefore, the physical properties required are completely different from those of a pressure sensitive adhesive sheet to be used for semiconductor processing in which the adhesive strength is made significantly different between before and after the energy ray irradiation.

Here, the pressure sensitive adhesive of Patent Literature 1 is designed such that the pressure sensitive adhesive component itself is allowed to have an antistatic property. In such an antistatic pressure sensitive adhesive component, if the composition and the like of the antistatic pressure sensitive adhesive component are varied to control either of the pressure sensitive adhesive property or the antistatic property for application to semiconductor processing, the other property is also affected. Accordingly, the degree of freedom in design may be restricted in such an antistatic pressure sensitive adhesive component.

The present invention has been created in consideration of such actual circumstances as described above, and an object of the present invention is to provide a sheet for semiconductor processing that can suppress contamination of an adherend at the time of peeling after energy ray irradiation while exhibiting a sufficient antistatic property.

Means for Solving the Problems

To achieve the above object, first, the present invention provides a sheet for semiconductor processing, the sheet comprising a base material and a pressure sensitive adhesive layer laminated on at least one surface of the base material, the pressure sensitive adhesive layer being formed of a pressure sensitive adhesive composition, the pressure sensitive adhesive composition containing a polymer having a salt and an energy ray curable group and an energy ray curable pressure sensitive adhesive component (excluding the polymer) (Invention 1).

The sheet for semiconductor processing according to the present invention may be, but is not limited to, a dicing sheet used for a dicing step for semiconductor wafers and various packages or a back grinding sheet used for a back grinding step for semiconductor wafers and the like, for example. In particular, the sheet for semiconductor processing according to the present invention may preferably be used as a dicing sheet.

Embodiments of the sheet for semiconductor processing according to the present invention include those having another pressure sensitive adhesive layer (and base material) for attaching a ring frame thereto, e.g. those provided with a circular pressure sensitive adhesive member or the like to surround a portion to be attached to a wafer. Embodiments of the sheet for semiconductor processing according to the present invention further include those in which the pressure sensitive adhesive layer is partially provided on the base material, e.g. those in which the pressure sensitive adhesive layer is provided only at a circumferential edge portion of the base material and is not provided in the inner circumferential portion. The term "sheet" as used in the present invention encompasses the concept of a "tape."

The sheet for semiconductor processing according to the above invention (Invention 1) exhibits a sufficient antistatic property because the polymer contained in the pressure sensitive adhesive composition has a salt (cation). Moreover, according to the feature that the above polymer has an energy ray curable group, the energy ray irradiation causes the polymer molecules, or the polymer and the energy ray curable component, to react with each other to be cross-linked. This can reduce the occurrence of particles attaching to an adherend when the adherend is peeled off after the energy ray irradiation, thereby suppressing the contamination of the adherend.

In the above invention (Invention 1), it is preferred that a content of the polymer in the pressure sensitive adhesive composition is 0.5 to 65 mass % (Invention 2).

In the above invention (Invention 1 or 2), it is preferred that a weight-average molecular weight of the polymer is 500 to 200,000 (Invention 3).

In the above invention (Invention 1 to 3), it is preferred that the polymer has a (meth) acryloyl group as the energy ray curable group (Invention 4).

In the above invention (Invention 1 to 4), it is preferred that a content of the energy ray curable group per a unit mass of the polymer is $5 \times 10^{-5}$ to $2 \times 10^{-3}$ mol/g (Invention 5).

In the above invention (Invention 1 to 5), the energy ray curable pressure sensitive adhesive component may contain an acrylic-based polymer without energy ray curability and an energy ray curable compound (Invention 6), and may also contain an acrylic-based polymer having a side chain to which an energy ray curable group is introduced (Invention 7).

In the above invention (Invention 1 to 7), it is preferred that the energy ray curable pressure sensitive adhesive component contains a cross-linker (Invention 8).

In the above invention (Invention 1 to 8), it is preferred that the salt is a quaternary ammonium salt (Invention 9).

In the above invention (Invention 6 or 7), it is preferred that the acrylic-based polymer has an ether bond at a side chain (Invention 10).

Advantageous Effect of the Invention

The sheet for semiconductor processing according to the present invention can suppress contamination of an adherend, such as a wafer and chips, at the time of peeling after energy ray irradiation while exhibiting a sufficient antistatic property.

BRIEF DESCRIPTION OF DRAWING(S)

FIG. 1 is a cross-sectional view of a sheet for semiconductor processing according to an embodiment of the present invention.

MODE(S) FOR CARRYING OUT THE INVENTION

Embodiments of the present invention will be described hereinafter.

FIG. 1 is a cross-sectional view of a sheet for semiconductor processing according to an embodiment of the present invention. The sheet for semiconductor processing 1 according to the present embodiment is configured to comprise a base material 2 and a pressure sensitive adhesive layer 3 laminated on one surface (the upper surface in FIG. 1) of the base material 2. The sheet for semiconductor processing 1 according to the present embodiment can be used as a dicing sheet, back grinding sheet, or the like, but the following description will focus on the case of use as a dicing sheet.

1. Base Material

Constituent materials of the base material 2 of the sheet for semiconductor processing 1 according to the present embodiment are not particularly limited, provided that the sheet for semiconductor processing 1 can properly function during desired steps, such as dicing step/expanding step or back grinding step. The base material 2 may ordinarily be constituted of a film that comprises a resin-based material as the main material. Specific examples of the film include: ethylene-based copolymer film, such as ethylene-vinyl acetate copolymer film, ethylene-(meth)acrylic acid copolymer film and ethylene-(meth)acrylic ester copolymer film; polyolefin-based film, such as low-density polyethylene (LDPE) film, linear low-density polyethylene (LLDPE) film, high-density polyethylene (HDPE) film and other polyethylene films, polypropylene film, polybutene film, polybutadiene film, polymethylpentene film, ethylene-norbornene copolymer film and norbornene resin film; polyvinyl chloride-based film, such as polyvinyl chloride film and vinyl chloride copolymer film; polyester-based film, such as polyethylene terephthalate film and polybutylene terephthalate film; polyurethane film; polyimide film; polystyrene film; polycarbonate film; and fluorine resin film. There may also be used a modified film thereof, such as a cross-linked film and an ionomer film. The above base material 2 may be a film comprising one type thereof, or may also be a laminated film comprising a combination of two or more types thereof. The "(meth)acrylic acid" as used in the present description means both acrylic acid and methacrylic acid. The same applies to other similar terms.

It is preferred that the film constituting the base material 2 comprises at least one type of an ethylene-based copolymer film and a polyolefin-based film. The ethylene-based copolymer film is easy to control its mechanical characteristics in a wide range such as by varying the copolymerization ratio. Therefore, the base material 2 comprising an ethylene-based copolymer film may easily fulfill the mechanical characteristics that are needed as those of the base material of the sheet for semiconductor processing 1 according to the present embodiment. In addition, the ethylene-based copolymer film has a relatively high interfacial adhesion property to the pressure sensitive adhesive layer 3, and therefore is unlikely to cause delamination at the interface between the base material 2 and the pressure sensitive adhesive layer 3 when used as a part of a sheet for semiconductor processing.

Here, some of films such as a polyvinyl chloride-based film may contain a large amount of components that negatively affect the properties as those of a sheet for semiconductor processing. For example, in a polyvinyl chloride-based film and the like, a plasticizer contained in the film may migrate from the base material 2 to the pressure sensitive adhesive layer 3 and may then be distributed in a surface of the pressure sensitive adhesive layer 3 opposite to the surface facing the base material 2, thereby to deteriorate the pressure sensitive adhesive property of the pressure sensitive adhesive layer 3 to an adherend (such as a semiconductor wafer and chips). In contrast, the ethylene-based copolymer film and polyolefin-based film contain only a small amount of components that negatively affect the properties as those of a sheet for semiconductor processing, and therefore a problem is unlikely to occur such as that the pressure sensitive adhesive property of the pressure sensitive adhesive layer 3 to the adherend is deteriorated. That is, the ethylene-based copolymer film and polyolefin-based film have an excellent chemical stability.

The base material 2 used in the present embodiment may also contain various additives, such as pigment, fire retardant, plasticizer, antistatic, glidant and filler, in the film that contains the above resin-based material as the main material. Examples of the pigment include titanium dioxide and carbon black. Examples of the filler include an organic material such as melamine resin, an inorganic material such as fumed silica, and a metal-based material such as nickel particle. The content of such additives is not particularly limited, but may have to be within a range in which the base material 2 exhibits a desirable function and does not lose the flatness and/or flexibility.

When ultraviolet ray is used as an energy ray that is irradiated to cure the pressure sensitive adhesive layer 3, it is preferred that the base material 2 has transparency for the ultraviolet ray. When electron ray is used as the energy ray, it is preferred that the base material 2 has transparency for the electron ray.

It is preferred that a component having one or more types selected from the group consisting of a carboxyl group and ion and salt thereof is present at a surface of the base material 2 at the side of the pressure sensitive adhesive layer 3 (referred also to as a "base material adhering surface," hereinafter). The above component in the base material 2 and components relating to the pressure sensitive adhesive layer (there may be exemplified components that constitute the pressure sensitive adhesive layer 3 and components, such as a cross-linker, that are used when forming the pressure sensitive adhesive layer 3) may chemically interact with each other thereby to reduce the possibility of occurrence of delamination therebetween. A specific approach for allowing such a component to be present at the base material adhering surface is not particularly limited. For example, such a specific approach may include configuring the base material 2 itself of an ethylene-(meth)acrylic acid copolymer film, an ionomer resin film or the like, and employing a resin having one or more types selected from the group consisting of a carboxyl group and ion and salt thereof, as the resin to be a material that constitutes the base material 2. Another approach for allowing the above component to be present at the base material adhering surface may be such that a polyolefin-based film is used as the base material 2, for example, and the side of the base material adhering surface is subjected to corona treatment and/or provided with a primer layer. In addition, one or more types of coating films may be provided on the opposite surface of the base material 2 to the base material adhering surface. These primer layer and coating films may contain an antistatic. This allows the sheet for semiconductor processing 1 to exhibit more excellent antistatic property.

The thickness of the base material 2 is not limited, provided that the sheet for semiconductor processing 1 can properly function during desired steps. The thickness may preferably be within a range of 20 to 450 μm, more preferably within a range of 25 to 400 μm, and particularly preferably within a range of 50 to 350 μm.

The fracture elongation of the base material 2 in the present embodiment may preferably be 100% or more, and particularly preferably 200% to 1,000%, as a value measured at 23° C. and a relative humidity of 50%. Here, the fracture elongation is an elongation percentage of the length of a test piece when the test piece fractures to the original length in a tensile test in accordance with JIS K7161: 1994 (ISO 527-1 1993).

When the above fracture elongation is 100% or more, the sheet for semiconductor processing according to the present embodiment is unlikely to fracture in the case of being used during the expanding step, and the chips formed by cutting the wafer can be easily separated from one another.

The tensile stress at a strain of 25% of the base material 2 in the present embodiment may preferably be 5 to 15 N/10 mm, and the maximum tensile stress may preferably be 15 to 50 MPa. Here, the tensile stress at a strain of 25% and the maximum tensile stress are to be measured by a test in accordance with JIS K7161: 1994. According to the feature that the tensile stress at a strain of 25% is 5 N/10 mm or more and/or the maximum tensile stress is 15 MPa or more, when the sheet for semiconductor processing 1 is fixed to a frame such as a ring frame after a workpiece is attached to the sheet for semiconductor processing 1, a play can be suppressed from being generated in the base material 2 to prevent the occurrence of errors in transportation. According to the feature that the tensile stress at a strain of 25% is 15 N/10 mm or less and/or the maximum tensile stress is 50 MPa or less, troubles such as that the sheet for semiconductor processing 1 itself is detached from the ring frame in the expanding step can be suppressed. The fracture elongation, the tensile stress at a strain of 25%, and the maximum tensile stress as described above refer to values measured in the longitudinal direction of an original sheet of the base material 2.

2. Pressure Sensitive Adhesive Layer

The pressure sensitive adhesive layer 3 of the sheet for semiconductor processing 1 according to the present embodiment is formed of a pressure sensitive adhesive composition that contains an energy ray curable pressure sensitive adhesive component (A) and a polymer (B) having a salt and an energy ray curable group (which may be referred to as a "energy ray curable antistatic polymer (B)," hereinafter). The energy ray curable pressure sensitive adhesive component (A) is not to contain the energy ray curable antistatic polymer (B). It is preferred that the pressure sensitive adhesive composition in the present embodiment contains a cross-linker (C) which will be described later.

(1) Energy Ray Curable Pressure Sensitive Adhesive Component (A)

It is preferred that the energy ray curable pressure sensitive adhesive component (A) contains an acrylic-based polymer (A1) without energy ray curability and an energy ray curable compound (A2), or contains an acrylic-based polymer (A3) having a side chain to which an energy ray curable group is introduced. When the energy ray curable pressure sensitive adhesive component (A) contains an acrylic-based polymer (A3) having a side chain to which an energy ray curable group is introduced, the energy ray curable pressure sensitive adhesive component (A) may contain only the acrylic-based polymer (A3) as the energy ray curable pressure sensitive adhesive component, or may also contain the acrylic-based polymer (A3) and the acrylic-based polymer (A1) without energy ray curability and/or the energy ray curable compound (A2). The term "polymer" as used in the present description encompasses the concept of a "copolymer."

(1-1) Acrylic-Based Polymer (A1) without Energy Ray Curability

When the pressure sensitive adhesive composition to form the pressure sensitive adhesive layer 3 in the present embodiment contains the acrylic-based polymer (A1) without energy ray curability, the acrylic-based polymer (A1) may be contained without any change in the pressure sensitive adhesive composition, or may also be contained as a cross-linked product obtained by a cross-linking reaction of at least a part of the acrylic-based polymer (A1) and a cross-linker (C) to be described later.

Conventionally known acrylic-based polymer may be used as the acrylic-based polymer (A1). The acrylic-based polymer (A1) may be a homopolymer formed of one type of acrylic-based monomer, a copolymer formed of plural types of acrylic-based monomers, or a copolymer formed of one or more types of acrylic-based monomers and monomer or monomers other than the acrylic-based monomers. Specific types of a compound to be an acrylic-based monomer are not particularly limited, and specific examples thereof include (meth)acrylic acid, (meth)acrylic ester, and derivatives thereof (such as acrylonitrile and itaconic acid). Specific examples of the (meth)acrylic ester include: (meth)acrylate having a chain-like skeleton, such as methyl (meth)acrylate, ethyl (meth)acrylate, propyl (meth)acrylate, butyl (meth) acrylate and 2-ethylhexyl (meth)acrylate; (meth)acrylate having a cyclic skeleton, such as cyclohexyl (meth)acrylate, benzyl (meth)acrylate, isobornyl (meth)acrylate, dicyclopentanyl (meth)acrylate and imide acrylate; (meth)acrylate having a hydroxy group, such as 2-hydroxyethyl (meth) acrylate and 2-hydroxypropyl (meth)acrylate; and (meth) acrylate having a reactive functional group other than hydroxy group, such as glycidyl (meth)acrylate and N-methylaminoethyl (meth)acrylate. Examples of a monomer other than the acrylic-based monomers include olefin such as ethylene and norbornene, vinyl acetate, and styrene. When the acrylic-based monomer is alkyl (meth)acrylate, it is preferred that the carbon number of the alkyl group is within a range of 1 to 18.

It is also preferred herein that the acrylic-based polymer (A1) has an ether bond at a side chain. By using the acrylic-based polymer (A1) having an ether bond at a side chain, the antistatic property can be improved (surface resistivity can be reduced) without increasing the additive amount of the energy ray curable antistatic polymer (B). That is, even when the additive amount of the energy ray curable antistatic polymer (B) is relatively small, an antistatic property can be obtained, comparable with or higher than that when the additive amount of the energy ray curable antistatic polymer (B) is relatively large. Therefore, the antistatic property can be improved without sacrificing the properties of particle suppression and chipping suppression. Such an advantageous effect may be enhanced as the number of ether bonds at a side chain or side chains increases.

To obtain the acrylic-based polymer (A1) having an ether bond at a side chain, (meth)acrylate having an ether bond may be used as a constituent monomer of the polymer. Examples of the (meth)acrylate having an ether bond include methoxyethyl (meth)acrylate, ethoxyethyl (meth) acrylate, phenoxyethyl (meth)acrylate, tetrahydrofurfuryl (meth)acrylate, ethoxyethoxyethyl (meth)acrylate, ethoxydiethylene glycol (meth)acrylate, methoxytriethylene glycol (meth)acrylate, methoxypolyethylene glycol (meth)acrylate, (2-methyl-2-ethyl-1,3-dioxolan-4-yl)methyl (meth)acrylate, and (3-ethyloxetane-3-yl)methyl (meth)acrylate.

The ratio of a mass of a structural portion originated from the (meth)acrylate having an ether bond to a mass of the acrylic-based polymer (A1) as a whole may preferably be 5 to 75 mass %, particularly preferably 12 to 70 mass %, and further preferably 20 to 65 mass %. According to the feature that the ratio of a mass of a structural portion originated from the (meth)acrylate having an ether bond falls within the above range, the previously-described advantageous effect of improving the antistatic property can be more easily obtained.

When the pressure sensitive adhesive composition to form the pressure sensitive adhesive layer 3 in the present embodiment contains a cross-linker (C) as will be described later, it is preferred that the acrylic-based polymer (A1) has a reactive functional group that reacts with the cross-linker (C). The type of the reactive functional group is not particularly limited, and may be appropriately determined based on the type of the cross-linker (C) and the like.

For example, when the cross-linker (C) is an epoxy-based compound, examples of the reactive functional group possessed by the acrylic-based polymer (A1) include carboxyl group, amino group, and amide group, among which carboxyl group may be preferred because of high reactivity with the epoxy group. When the cross-linker (C) is a polyisocyanate compound, examples of the reactive functional group possessed by the acrylic-based polymer (A1) include hydroxy group, carboxyl group, and amino group, among which hydroxy group may be preferred because of high reactivity with the isocyanate group.

Method of introducing the reactive functional group into the acrylic-based polymer (A1) is not particularly limited, and one example thereof may be a method of forming the acrylic-based polymer (A1) using a monomer having the reactive functional group and causing the polymer to contain in its skeleton a constituent unit based on a monomer having the reactive functional group. For example, when a carboxyl group is introduced into the acrylic-based polymer (A1), the acrylic-based polymer (A1) may be formed using a monomer having a carboxyl group, such as (meth) acrylic acid.

When the acrylic-based polymer (A1) has a reactive functional group, in view of achieving the degree of cross-linking within a suitable range, the ratio of a mass of a structural portion originated from a monomer having the reactive functional group to a mass of the acrylic-based polymer (A1) as a whole may preferably be about 1 to 20 mass %, and more preferably 2 to 10 mass %.

In view of the film-forming ability at the time of coating, the weight-average molecular weight (Mw) of the acrylic-based polymer (A1) may preferably be 10,000 to 2,000,000, and more preferably 100,000 to 1,500,000. The weight-average molecular weight as used in the present description refers to a polystyrene equivalent value measured by the gel permeation chromatography (GPC) method. The glass-transition temperature Tg of the acrylic-based polymer (A1) may preferably be within a range of −70° C. to 30° C., and further preferably within a range of −60° C. to 20° C. The glass-transition temperature can be calculated using the Fox equation.

(1-2) Energy Ray Curable Compound (A2)

When the energy ray curable pressure sensitive adhesive component (A) contains the acrylic-based polymer (A1) without energy ray curability, the energy ray curable pressure sensitive adhesive component (A) may further contain the energy ray curable compound (A2). The energy ray curable compound (A2) is a compound that has an energy ray curable group and is polymerized by irradiation of an energy ray such as ultraviolet ray and electron ray.

The energy ray curable group possessed by the energy ray curable compound (A2) is a group that is energy ray curable and includes a carbon-carbon double bond, for example, and specific examples thereof may include (meth)acryloyl group and vinyl group.

An example of the energy ray curable compound (A2) is not particularly limited, provided that it has the above energy ray curable group, but may preferably be a compound having a low molecular weight (monofunctional or polyfunctional monomer or oligomer) in view of general versatility. Specific examples of the energy ray curable compound (A2) having a low molecular weight include acrylate-based compound, such as trimethylolpropane triacrylate, tetramethylolmethane tetraacrylate, pentaerythritol triacrylate, dipentaerythritol monohydroxy pentaacrylate, dipentaerythritol hexaacrylate, 1,4-butylene glycol diacrylate, 1,6-hexanediol diacrylate, cyclic aliphatic skeleton-containing acrylate such as dicyclopentadiene dimethoxy diacrylate and isobornyl acrylate, polyethylene glycol diacrylate, oligoester acrylate, urethane acrylate oligomer, epoxy-modified acrylate, polyether acrylate and itaconic acid oligomer.

The molecular weight of the energy ray curable compound (A2) may ordinarily be about 100 to 30,000, and preferably about 300 to 10,000. In general, the energy ray curable compound (A2) may be used at a ratio of about 10 to 400 mass parts, and preferably about 30 to 350 mass parts, to 100 mass parts of the acrylic-based polymer (A1).

(1-3) Acrylic-Based Polymer (A3) Having Side Chain to which Energy Ray Curable Group is Introduced When the energy ray curable pressure sensitive adhesive component (A) in the present embodiment contains the acrylic-based polymer (A3) having a side chain to which an energy ray curable group is introduced, the acrylic-based polymer (A3) may be contained without any change in the pressure sensitive adhesive composition, or may also be contained as a cross-linked product obtained by a cross-linking reaction of at least a part of the acrylic-based polymer (A3) and a cross-linker (C) to be described later.

The main skeleton of the acrylic-based polymer (A3) having a side chain to which an energy ray curable group is introduced is not particularly limited, and a similar one to that of the previously-described acrylic-based polymer (A1) may be exemplified. Like the acrylic-based polymer (A1), the acrylic-based polymer (A3) may also preferably have an ether bond at a side chain.

The energy ray curable group introduced to a side chain of the acrylic-based polymer (A3) is a group that is energy ray curable and includes a carbon-carbon double bond, for example, and specific examples thereof may include (meth) acryloyl group. The energy ray curable group may also be bonded to the acrylic-based polymer (A3) via an alkylene group, alkyleneoxy group, polyalkyleneoxy group, or the like.

The acrylic-based polymer (A3) having a side chain to which an energy ray curable group is introduced can be obtained by reaction of an acrylic-based polymer that contains a functional group such as hydroxy group, carboxyl group, amino group, substituted amino group and epoxy group, for example, and a curable group-containing compound that has a substituted group reacting with the functional group and one to five energy ray curable carbon-carbon double bonds in one molecule. That acrylic-based polymer can be obtained by copolymerization of a (meth) acrylic ester monomer that has a functional group such as hydroxy group, carboxyl group, amino group, substituted amino group and epoxy group or derivatives thereof and a monomer that constitutes the previously-described component (A1). Examples of the above curable group-containing compound include (meth)acryloyl oxyethyl isocyanate, (meth)isopropenyl-α,α-dimethyl benzyl isocyanate, (meth) acryloyl isocyanate, allyl isocyanate, glycidyl (meth)acrylate, and (meth)acrylic acid.

When the pressure sensitive adhesive composition to form the pressure sensitive adhesive layer 3 in the present embodiment contains the cross-linker (C) to be described later, it is preferred that the acrylic-based polymer (A3) having a side chain to which an energy ray curable group is introduced has a reactive functional group that reacts with the cross-linker (C). The type of the reactive functional group is not particularly limited, and a similar one to that of the previously-described acrylic-based polymer (A1) may be exemplified.

The weight-average molecular weight (Mw) of the acrylic-based polymer (A3) having a side chain to which an energy ray curable group is introduced may preferably be 100,000 to 2,000,000, and more preferably 300,000 to 1,500,000.

The glass-transition temperature (Tg) of the acrylic-based polymer (A3) may preferably be within a range of −70° C. to 30° C., and more preferably within a range of −60° C. to 20° C. As used in the present description, the glass-transition temperature (Tg) of the acrylic-based polymer (A3) refers to a value before the reaction with the curable group-containing compound.

(2) Energy Ray Curable Antistatic Polymer (B)

The pressure sensitive adhesive composition to form the pressure sensitive adhesive layer 3 in the present embodiment contains, in addition to the previously-described energy ray curable pressure sensitive adhesive component (A), a polymer (B) having a salt and an energy ray curable group (energy ray curable antistatic polymer (B)).

The energy ray curable antistatic polymer (B) has a salt (cation) thereby to exhibit the antistatic property. The energy ray curable antistatic polymer (B) may have the salt at the main chain or side chain, but may preferably have the salt at the side chain. The salt is composed of a cation and a counterpart anion, and may preferably be composed of an onium cation and a counterpart anion. The salt may be composed of a cation that is covalently bonded to the energy ray curable antistatic polymer (B) and a counterpart anion, or may also be composed of an anion that is covalently bonded to the energy ray curable antistatic polymer (B) and a counterpart cation.

Examples of the salt include a quaternary ammonium salt, phosphonium salt, sulfonium salt, oxonium salt, diazonium salt, chloronium salt, iodonium salt, and pyrylium salt. One type of these salts can be solely used, or two or more types can be used in combination. As will be understood, the quaternary ammonium salt is composed of a quaternary ammonium cation and a counterpart anion, and other salts are also composed in a similar manner.

Among the above, the quaternary ammonium salt is particularly preferred because it exhibits an excellent antistatic property. Here, the above "quaternary ammonium cation" means an onium cation of nitrogen, and examples thereof include heterocyclic onium ions, such as imidazolium and pyridium. Examples of the quaternary ammonium cation include: alkyl ammonium cation (examples of the "alkyl" as referred to herein include hydrocarbon groups of which the number of carbon atoms is 1 to 30 as well as those substituted with hydroxyalkyl and alkoxyalkyl); 1-ring heterocyclic cation, such as pyrrolidinium cation, pyrrolium cation, imidazolium cation, pyrazolium cation, pyridinium cation, piperidinium cation and piperazinium cation; and condensed heterocyclic cation, such as indolium cation, benzimidazolium cation, carbazolium cation and quinolinium cation. These examples include those in which a hydrocarbon group, hydroxyalkyl group or alkoxyalkyl group of which the number of carbon atoms is 1 to 30 (e.g. the number of carbon atoms is 1 to 10) is bonded to nitrogen atom and/or ring.

Examples of the above anion include anions having halogen atoms and derivatives of oxo acids such as carboxylic acid, sulfonic acid and phosphoric acid (e.g. sulfuric acid hydrogen, methane sulfonate, ethyl sulfate, dimethyl phosphate, 2-(2-methoxyethoxy)ethyl sulfate, dicyanamide, etc.), among which anions having halogen atoms are preferred. Specific examples include: anions having nitrogen atoms, such as $(FSO_2)_2N^-$ (bis{(fluoro)sulfonyl}imide anion), $(CF_3SO_2)_2N^-$ (bis{(trifluoromethyl)sulfonyl}imide anion), $(C_2F_5SO_2)_2N^-$ (bis{(pentafluoroethyl)sulfonyl}imide anion), $CF_3SO_2—N—COCF_3^-$, $R—SO_2—N—SO_2CF_3^-$ (R is an aliphatic group) and $ArSO_2—N—SO_2CF_3^-$ (Ar is an aromatic group); and anions having fluorine atoms as halogen atoms, such as $CnF_{2n+1}CO_2^-$ (n is an integer of 1 to 4), $(CF_3SO_2)_3C^-$, $CnF_{2n+1}SO_3^-$ (n is an integer of 1 to 4), $BF_4^-$ and $PF_6^-$. Among them, bis{(fluoro)sulfonyl}imide anion, bis{(trifluoromethyl)sulfonyl}imide anion, bis{(pentafluoroethyl)sulfonyl}imide anion, 2,2,2-trifluoro-N-{(trifluoromethyl)sulfonyl}acetamide anion, tetrafluoroborate anion, and hexafluorophosphate anion are particularly preferred.

According to the feature that the energy ray curable antistatic polymer (B) has an energy ray curable group at aside chain, the energy ray irradiation to the pressure sensitive adhesive layer 3 causes the molecules of the energy ray curable antistatic polymer (B), or the energy ray curable antistatic polymer (B) and the previously-described energy ray curable pressure sensitive adhesive component (A), to react with each other to be crosslinked. This can suppress the bleeding out of the energy ray curable antistatic polymer (B) from the pressure sensitive adhesive layer 3 and avoid the generation of residual substances (particles) of the pressure sensitive adhesive when the sheet for semiconductor processing 1 is peeled off, and the contamination of the adherend can thus be suppressed.

The energy ray curable group is a group that is energy ray curable and includes a carbon-carbon double bond, for example. Specific examples thereof may include (meth)acryloyl group and vinyl group, among which the (meth)acryloyl group, in particular methacryloyl group, is preferred.

The content of the energy ray curable group per a unit mass of the energy ray curable antistatic polymer (B) may preferably be $5 \times 10^{-5}$ to $2 \times 10^{-3}$ mol/g, particularly preferably $1 \times 10^{-4}$ to $1.5 \times 10^{-3}$ mol/g, and further preferably $3 \times 10^{-4}$ to $1 \times 10^{-3}$ mol/g. According to the feature that the content of the energy ray curable group is $5 \times 10^{-5}$ mol/g or more, the energy ray irradiation causes the molecules of the energy ray curable antistatic polymer (B), or the energy ray curable antistatic polymer (B) and the energy ray curable pressure sensitive adhesive component (A), to react sufficiently with each other, and the contamination of the adherend due to the pressure sensitive adhesive layer 3 can be effectively suppressed. Moreover, according to the feature that the content of the energy ray curable group is $2 \times 10^{-3}$ mol/g or less, the pressure sensitive adhesive layer is not excessively cured when being cured by the energy ray, and unintended delamination from the adherend after the curing can be suppressed.

The energy ray curable antistatic polymer (B) in the present embodiment may preferably be obtained by, after copolymerization of a polymerizable monomer having a salt, in particular a polymerizable monomer having a quaternary ammonium salt (which may be referred to as a "quaternary ammonium salt monomer (B1)," hereinafter) and a polymerizable monomer having a reactive functional group (which may be referred to as a "reactive functional group-containing monomer (B2)," hereinafter), for example, and other polymerizable monomers (B3) if necessary, reacting them with a curable group-containing compound (B4) having a substituted group reacting with the above reactive functional group and an energy ray curable group, but the present invention is not limited thereto.

The above quaternary ammonium salt monomer (B1) has a polymerizable group and a salt that is composed of a quaternary ammonium cation and a counterpart anion, and may preferably comprise a salt that is composed of a quaternary ammonium cation having a polymerizable group and a counterpart anion. Examples of the polymerizable group include: carbon-carbon unsaturated groups, such as (meth)acryloyl group, vinyl group and allyl group; cyclic ethers such as having epoxy group and oxetane group; cyclic sulfides such as tetrahydrothiophene; and isocyanate groups, among which (meth)acryloyl group and vinyl group are preferred.

Examples of the quaternary ammonium cation having the above polymerizable group include trialkyl aminoethyl (meth)acrylate ammonium cation, trialkyl aminopropyl (meth)acrylamide ammonium cation, 1-alkyl-3-vinylimidazolium cation, 4-vinyl-1-alkylpyridinium cation, 1-(4-vinylbenzyl)-3-alkylimidazolium cation, 1-(vinyloxyethyl)-3-alkylimidazolium cation, 1-vinylimidazolium cation, 1-allylimidazolium cation, N-alkyl-N-allylammonium cation, 1-vinyl-3-alkylimidazolium cation, 1-glycidyl-3-alkylimidazolium cation, N-allyl-N-alkylpyrrolidinium cation, and quaternary diallyl dialkyl ammonium cation (the "alkyl" as referred to herein refers to a hydrocarbon group of which the number of carbon atoms is 1 to 10). Among them, trialkyl aminoethyl (meth)acrylate ammonium cation (=[2-(methacryloyloxy)ethyl]trialkylammonium cation) is preferred.

The above quaternary ammonium salt monomer (B1) may be a salt that is composed of the above quaternary ammonium cation having a polymerizable group and the above anion, and examples thereof include [2-(methacryloyloxy)ethyl]trimethyl ammonium bis(trifluoromethylsulfonyl)imide. The quaternary ammonium salt monomer (B1) may be used in one type or two or more types.

In the energy ray curable antistatic polymer (B), the ratio of a mass of a structural portion originated from the quaternary ammonium salt monomer (B1) to a mass of the polymer (B) as a whole may preferably be 20 to 80 mass %, particularly preferably 25 to 75 mass %, and further preferably 35 to 60 mass %. According to the feature that the ratio of amass of a structural portion originated from the quaternary ammonium salt monomer (B1) is 20 mass % or more, the energy ray curable antistatic polymer (B) can exhibit a sufficient antistatic property. On the other hand, according to the feature that the ratio of a mass of a structural portion originated from the quaternary ammonium salt monomer (B1) is 80 mass % or less, the ratio of a mass of a structural portion originated from other monomers can be controlled in a preferred range.

Examples of the above reactive functional group-containing monomer (B2) include (meth)acrylic acid and a (meth)acrylic ester monomer that has a functional group such as carboxyl group, hydroxy group, amino group, substituted amino group and epoxy group, among which (meth)acrylic acid may be preferred.

In the energy ray curable antistatic polymer (B), the ratio of a mass of a structural portion originated from the reactive functional group-containing monomer (B2) to amass of the polymer (B) as a whole may preferably be 1 to 35 mass %, particularly preferably 3 to 20 mass %, and further preferably 3 to 10 mass %. According to the feature that the ratio of a mass of a structural portion originated from the reactive functional group-containing monomer (B2) is within the above range, it is possible to control, within a preferred range, the amount of introducing the energy ray curable group based on the above curable group-containing compound (B4) into the energy ray curable antistatic polymer (B).

The energy ray curable antistatic polymer (B) may preferably contain the above other polymerizable monomers (B3), in particular an acrylic-based polymerizable monomer, as a monomer unit that constitutes the polymer (B), and may more preferably contain the acrylic-based polymerizable monomer as the main component. Examples of the other polymerizable monomers (B3) include (meth)acrylic ester. Examples of the (meth)acrylic ester include: (meth)acrylate having a chain-like skeleton, such as methyl (meth)acrylate, ethyl (meth)acrylate, propyl (meth)acrylate, butyl (meth) acrylate and 2-ethylhexyl (meth)acrylate; and (meth)acrylate having a cyclic skeleton, such as cyclohexyl (meth) acrylate, benzyl (meth)acrylate, isobornyl (meth)acrylate, dicyclopentanyl (meth)acrylate, tetrahydrofurfuryl (meth) acrylate and imide acrylate. When the (meth)acrylic ester is alkyl (meth)acrylic ester, it is preferred that the carbon number of the alkyl group is within a range of 1 to 18.

Examples of the above curable group-containing compound (B4) may include the curable group-containing compounds as exemplified in the examples of the acrylic-based polymer (A3). Glycidyl (meth)acrylate, (meth)acryloyl oxyethyl isocyanate and the like may be preferred as the curable group-containing compound (B4), among which glycidyl (meth)acrylate is particularly preferred.

Here, it is preferred that the curable group-containing compound (B4) and the above reactive functional group-containing monomer (B2) are reacted with each other so that the molar equivalent is approximately the equal quantity.

The weight-average molecular weight of the energy ray curable antistatic polymer (B) may preferably be 500 to 200,000, particularly preferably 800 to 100,000, and further preferably 800 to 50,000. According to the feature that the weight-average molecular weight of the energy ray curable antistatic polymer (B) is 500 or more, when the sheet for semiconductor processing 1 of the present embodiment is attached to an adherend, the bleeding out of the energy ray curable antistatic polymer (B) from the pressure sensitive adhesive layer 3 can be effectively suppressed. Moreover, according to the feature that the weight-average molecular weight of the energy ray curable antistatic polymer (B) is 200,000 or less, the pressure sensitive adhesive property of the pressure sensitive adhesive layer 3 may not be negatively affected. Specifically, while the molecular chain of the ionic energy ray curable antistatic polymer (B) tends to expand, this expansion may be suppressed to allow the pressure sensitive adhesive layer 3 to exhibit good pressure sensitive adhesive property without being cured, and the property of holding a semiconductor wafer can be maintained.

The content of the energy ray curable antistatic polymer (B) in the pressure sensitive adhesive composition of the present embodiment may preferably be 0.5 to 65 mass %, particularly preferably 10 to 50 mass %, and further preferably 13 to 30 mass %. According to the feature that the compounding amount of the energy ray curable antistatic polymer (B) is 0.5 mass % or more, the pressure sensitive adhesive layer 3 can have a sufficient antistatic property. Moreover, according to the feature that the compounding amount of the energy ray curable antistatic polymer (B) is 65 mass % or less, the cohesive strength of the pressure sensitive adhesive layer 3 before energy ray irradiation can be maintained at a high level to allow the pressure sensitive adhesive layer 3 to have preferred elasticity, so that the influence of vibration during the dicing may be suppressed, and the occurrence of chipping (cracks of chip end portions) can thus be effectively suppressed.

When the pressure sensitive adhesive composition in the present embodiment contains the previously-described energy ray curable compound (A2), the total content of the energy ray curable compound (A2) and energy ray curable antistatic polymer (B) in the pressure sensitive adhesive composition of the present embodiment may preferably be 10 to 75 mass %, particularly preferably 15 to 60 mass %, and further preferably 18 to 40 mass %. According to the feature that the total content of the energy ray curable compound (A2) and energy ray curable antistatic polymer (B) is 10 mass % or more, the pressure sensitive adhesive layer 3 can have a sufficient antistatic property. Moreover, according to the feature that the total content is 75 mass % or less, the cohesive strength of the pressure sensitive adhesive layer 3 may be maintained at a high level, and the occurrence of chipping can be effectively suppressed.

(3) Cross-Linker (C)

As previously described, the pressure sensitive adhesive composition to form the pressure sensitive adhesive layer 3 in the present embodiment may contain a cross-linker (C) that is reactive with the acrylic-based polymer (A1). In this case, the pressure sensitive adhesive layer 3 in the present embodiment may contain a cross-linked product obtained by the cross-linking reaction of the acrylic-based polymer (A1) and the cross-linker (C).

Examples of the type of the cross-linker (C) include: epoxy-based compound; polyisocyanate-based compound; metal chelate-based compound; polyimine compound such as aziridine-based compound; melamine resin; urea resin; dialdehydes; methylol polymer; metal alkoxide; and metal salt. Among them, epoxy-based compound or polyisocyanate compound is preferred for the reasons that the cross-linking reaction can be easily controlled, etc.

Examples of the epoxy-based compound include 1,3-bis (N,N'-diglycidylaminomethyl)cyclohexane, N,N,N',N'-tetraglycidyl-m-xylylenediamine, ethylene glycol diglycidylether, 1,6-hexanedioldiglycidylether, trimethylolpropane diglycidylether, diglycidylaniline, and diglycidylamine.

The polyisocyanate compound is a compound having two or more isocyanate groups in one molecule. Specific examples include: aromatic polyisocyanate, such as tolylene diisocyanate, diphenylmethane diisocyanate and xylylene diisocyanate; aliphatic polyisocyanate such as hexamethylene diisocyanate; alicyclic polyisocyanate, such as isophorone diisocyanate and hydrogenated diphenylmethane diisocyanate; other similar compounds; biuret products and isocyanurate products of these compounds; and adduct products that are reaction products of these compounds and low molecule active hydrogen-containing compounds, such as ethylene glycol, propylene glycol, neopentyl glycol, trimethylol propane and castor oil.

The content of the cross-linker (C) in the pressure sensitive adhesive composition to form the pressure sensitive adhesive layer 3 may preferably be 0.01 to 50 mass parts, and more preferably 0.1 to 10 mass parts, to the total amount of 100 mass parts of the energy ray curable pressure sensitive adhesive component (A) and energy ray curable antistatic polymer (B).

When the pressure sensitive adhesive composition to form the pressure sensitive adhesive layer 3 in the present embodiment contains the cross-linker (C), an appropriate cross-linking promoter may preferably be contained therein depending on the type of the cross-linker (C) and the like. For example, when the cross-linker (C) is a polyisocyanate compound, the pressure sensitive adhesive composition to form the pressure sensitive adhesive layer 3 may preferably contain an organometallic compound-based cross-linking promoter, such as an organotin compound.

(4) Other Components

The pressure sensitive adhesive composition to form the pressure sensitive adhesive layer 3 in the present embodiment may contain, in addition to the above components, various additives such as photopolymerization initiator, coloring material, e.g., colorant and pigment, flame retardant, and filler.

Examples of the photopolymerization initiator include photo initiators, such as benzoin compound, acetophenone compound, acyl phosphine oxide compound, titanocene compound, thioxanthone compound and peroxide compound, and photo sensitizers, such as amine and quinone. Specifically, there may be exemplified 1-hydroxycyclohexyl phenyl ketone, benzoin, benzoin methyl ether, benzoin ethyl ether, benzoin isopropyl ether, benzyl diphenyl sulfide, tetramethyl thiuram monosulfide, azobisisobutyronitrile, dibenzyl, diacetyl, β-chloroanthraquinone, 2,4,6-trimethyl benzoyl diphenyl phosphine oxide, and the like. When ultraviolet ray is used as the energy ray, the photopolymerization initiator may be compounded thereby to reduce the irradiation time and irradiation amount.

(5) Irradiation of Energy Ray

Examples of an energy ray for curing the previously-described energy ray curable pressure sensitive adhesive component (A) and energy ray curable antistatic polymer (B) include ionizing radiation, i.e. X-ray, ultraviolet ray, electron ray or the like. Among them, ultraviolet ray may be preferred because the introduction of irradiation equipment is relatively easy.

When ultraviolet ray is used as the ionizing radiation, near-ultraviolet rays including rays of wavelengths of about 200 to 380 nm may be used in view of easy management. The amount of light may be appropriately selected in accordance with the type of the energy ray curable groups possessed by the energy ray curable pressure sensitive adhesive component (A) and energy ray curable antistatic polymer (B) and the thickness of the pressure sensitive adhesive layer 3, and may ordinarily be about 50 to 500 mJ/cm$^2$, preferably 100 to 450 mJ/cm$^2$, and more preferably 200 to 400 mJ/cm$^2$. The illuminance of ultraviolet ray may ordinarily be about 50 to 500 mW/cm$^2$, preferably 100 to 450 mW/cm$^2$, and more preferably 200 to 400 mW/cm$^2$. The ultraviolet ray source is not particularly restricted, and examples thereof to be used include a high-pressure mercury lamp, a metal halide lamp, and a UV-LED.

When electron ray is used as the ionizing radiation, the accelerating voltage may be appropriately selected in accordance with the type of the energy ray curable groups possessed by the energy ray curable pressure sensitive adhesive component (A) and energy ray curable antistatic polymer (B) and the thickness of the pressure sensitive adhesive layer 3, and may preferably be about 10 to 1,000 kV in general. The amount of irradiated ray may be set within a range in which the polyfunctional acrylate-based energy ray curable compound (A2) is appropriately cured, which may ordinarily be a range of 10 to 1,000 krad. The electron ray source is not particularly restricted, and examples thereof to be used include various electron ray accelerators, such as those of Cockcroft-Walton type, Van de Graaff type, resonance transformer type, insulated core transformer type, linear type, dynamitron type, and high-frequency type.

(6) Physical Properties, Shape, etc.

(6-1) Thickness

The thickness of the pressure sensitive adhesive layer 3 in the present embodiment may be 2 to 50 μm, preferably 5 to 30 μm, and particularly preferably 8 to 20 μm. The thickness of the pressure sensitive adhesive layer 3 being 20 μm or less can suppress the amount of pressure sensitive adhesive aggregates generated when dicing an adherend such as a semiconductor wafer, and the troubles due to the pressure sensitive adhesive aggregates attaching to the chips, etc., are unlikely to occur. On the other hand, if the thickness of the pressure sensitive adhesive layer 3 is less than 2 μm, problems may possibly occur including that the variation in the pressure sensitive adhesive property of the pressure sensitive adhesive layer 3 is large.

(6-2) Surface Resistivity

The surface resistivity of the pressure sensitive adhesive layer 3 may preferably be $5 \times 10^{12} \Omega/\square$ or less, and particularly preferably $1 \times 10^7 \Omega/\square$ to $9 \times 10^{11} \Omega/\square$. According to the feature that the surface resistivity of the pressure sensitive adhesive layer 3 is within such a range, a preferred antistatic property can be obtained, and therefore, when the sheet for semiconductor processing 1 of the present embodiment is peeled off from the adherend, the adherend can be prevented from breakage due to the peeling charge.

The surface resistivity as referred to herein refers to a value measured at an applied voltage of 100 V using DIGITAL ELECTROMETER (available from ADVANTEST CORPORATION) after a sheet for semiconductor processing is cut into 100 mm×100 mm and humidity conditioning is performed under 23° C. and a relative humidity of 50% for 24 hours.

(6-3) Adhesive Strength

The ratio of an adhesive strength of the sheet for semiconductor processing 1 according to the present embodiment after energy ray irradiation to the adhesive strength before energy ray irradiation may preferably be 0.003 to 0.3, more preferably 0.005 to 0.1, and particularly preferably 0.008 to 0.05. When the above ratio of the adhesive strengths is within the above range, the balance between the adhesive strength before energy ray irradiation and the adhesive strength after energy ray irradiation is good, and a sufficient adhesive strength before energy ray irradiation and a moderate adhesive strength after energy irradiation may be easily achieved.

The adhesive strength as referred to herein refers to a peel strength (mN/25 mm) measured for an adherend of a mirror wafer using a method of 180° peeling in accordance with JIS Z0237: 2009. The adhesive strength after energy ray irradiation refers to a peel strength measured after attaching a sheet for semiconductor processing 1 to an adherend and then performing ultraviolet ray irradiation (illuminance: 230 mW/cm$^2$, light amount: 190 mJ/cm$^2$) from the side of the base material 2 of the sheet for semiconductor processing 1 in a nitrogen atmosphere.

The adhesive strength before energy ray irradiation of the sheet for semiconductor processing 1 may preferably be 2,000 to 20,000 mN/25 mm, more preferably 3,000 to 15,000 mN/25 mm, and particularly preferably 3,500 to 10,000 mN/25 mm. The adhesive strength before energy ray irradiation being within the above range allows the adherend to be steadily fixed during the processing steps for the adherend.

On the other hand, the adhesive strength after energy ray irradiation of the sheet for semiconductor processing 1 may preferably be 10 to 500 mN/25 mm, more preferably 30 to 300 mN/25 mm, and particularly preferably 50 to 200 mN/25 mm. The adhesive strength after energy ray irradiation being within the above range allows the adherend to easily be peeled off from the sheet for semiconductor processing 1 when removing the sheet and can suppress the cohesive fracture of the pressure sensitive adhesive layer 3 and contamination of the adherend due to particles when removing the sheet.

The pressure sensitive adhesive layer 3 in the present embodiment is formed of the previously-described pressure sensitive adhesive composition. Therefore, the adhesive strength before energy ray irradiation, the adhesive strength after energy ray irradiation, and the ratio therebetween of the sheet for semiconductor processing 1 can be easily controlled in the above ranges.

(6-4) Release Sheet

For the purpose of protecting the pressure sensitive adhesive layer 3 until the pressure sensitive adhesive layer 3 is attached to an adherend, the sheet for semiconductor processing 1 according to the present embodiment may be configured such that a release sheet is provisionally laminated on a surface of the pressure sensitive adhesive layer 3 opposite to the surface at the side of the base material 2. The release sheet may be arbitrarily configured, and examples thereof include a plastic film that has been subjected to release treatment using a release agent, etc. Specific examples of the plastic film include a film of polyester, such as polyethylene terephthalate, polybutylene terephthalate and polyethylene naphthalate, and a film of polyolefin, such as polypropylene and polyethylene. Examples of the release agent to be used include silicone-based, fluorine-based and long-chain alkyl-based ones, among which the silicone-based release agent is preferred because a stable property can be obtained at low cost. The thickness of the release sheet is not particularly restricted, but may ordinarily be about 20 to 250 μm.

3. Method of Manufacturing Sheet for Semiconductor Processing

The method of manufacturing the sheet for semiconductor processing 1 is not particularly limited in detail, provided that the pressure sensitive adhesive layer 3 formed of the previously-described pressure sensitive adhesive composition can be laminated on one surface of the base material 2. As one example, the pressure sensitive adhesive layer 3 can be formed through: preparing a composition for coating that contains the previously-described pressure sensitive adhesive composition and if necessary further contains some solvent or dispersant; applying the composition for coating to one surface of the base material 2 using a coater, such as die coater, curtain coater, spray coater, slit coater and knife coater, to form a coating film; and drying the coating film. Properties of the composition for coating are not particularly limited, provided that the coating can be performed, and the components for forming the pressure sensitive adhesive layer 3 may be contained therein as a solute or as a dispersed material.

When the composition for coating contains the cross-linker (C), conditions for the above drying (such as temperature and time) may be changed, or a heating process may be separately provided, thereby to progress the cross-linking reaction of the acrylic-based polymer (A1) and cross-linker (C) in the coating film, so that a cross-linked structure is formed with a desired existing density in the pressure sensitive adhesive layer 3. To sufficiently progress this cross-linking reaction, after the pressure sensitive adhesive layer 3 is laminated on the base material 2 using the above method or the like, aging may ordinarily be performed such that the obtained sheet for semiconductor processing 1 is stationarily placed, for example, in an environment of 23° C. and a relative humidity of 50% for several days.

Another example of a method of manufacturing the sheet for semiconductor processing 1 may include: applying the composition for coating to a release surface of the previously-described release sheet to form a coating film; drying it to form a laminate comprising the pressure sensitive adhesive layer 3 and the release sheet; and attaching a surface of the pressure sensitive adhesive layer 3 of this laminate opposite to the surface at the side of the release sheet to the base material 2, so that a laminate of the sheet for semiconductor processing 1 and the release sheet is obtained. The release sheet of this laminate may be removed as a process material, or may keep protecting the pressure sensitive adhesive layer 3 until the sheet for semiconductor processing 1 is attached to an adherend such as a semiconductor wafer.

4. Method of Manufacturing Chips

The sheet for semiconductor processing 1 according to the present embodiment may be used for a method of manufacturing chips from a semiconductor wafer, which will be described as one example below.

When the sheet for semiconductor processing 1 according to the present embodiment is used, the surface at the side of the pressure sensitive adhesive layer 3 (i.e. the surface of the pressure sensitive adhesive layer 3 opposite to the base material 2) is attached to a semiconductor wafer. If a release sheet is laminated on the surface of the sheet for semiconductor processing 1 at the side of the pressure sensitive adhesive layer 3, the release sheet is removed to expose the surface at the side of the pressure sensitive adhesive layer 3, so that the surface may be attached to the attaching surface of the semiconductor wafer. In general, peripheral portion of the sheet for semiconductor processing 1 is attached, via the pressure sensitive adhesive layer 3 provided at that portion, to a circular jig referred to as a ring frame for transportation and/or fixation to an apparatus.

Subsequently, the dicing step is performed to obtain a plurality of chips from the semiconductor wafer. In the pressure sensitive adhesive layer 3 of the sheet for semiconductor processing 1, the cohesive property before energy ray irradiation may be maintained at a high level by adjusting the content of each component of the pressure sensitive adhesive composition forming the pressure sensitive adhesive layer 3 (e.g. by setting the content of the energy ray curable antistatic polymer (B) in the pressure sensitive adhesive composition to 65 mass % or less), the pressure sensitive adhesive layer 3 will have a preferred elasticity during the dicing step. Therefore, by using the sheet for semiconductor processing 1 according to the present embodiment, the influence of vibration during the dicing step may be suppressed, and the occurrence of chipping can be suppressed.

After completing the dicing step, energy ray irradiation is performed from the side of the base material 2 of the sheet for semiconductor processing 1. This progresses the polymerization reaction of the energy ray curable groups possessed by the energy ray curable pressure sensitive adhesive component (A) and energy ray curable antistatic polymer (B), which are contained in the pressure sensitive adhesive layer 3, to reduce the pressure sensitive adhesive property, and the chips can be picked up.

After the energy ray irradiation, as one example for easy pickup of the plurality of chips closely disposed on the sheet for semiconductor processing 1, an expanding step is performed to elongate the sheet for semiconductor processing 1 in a direction or directions in the flat surface. The degree of this elongation may appropriately be set in consideration of the space which the closely disposed chips should have, the tensile strength of the base material 2, etc. In an alternative embodiment, the expanding step may be performed before the energy ray irradiation.

After the expanding step, pickup of the chips on the pressure sensitive adhesive layer 3 is performed. During the pickup, which may be performed using a general-purpose means such as a suction collet, it is preferred to perform lifting up of a targeted chip using a pin, needle, etc., from the side of the base material 2 of the sheet for semiconductor processing 1, in order to allow easy pickup.

Here, in the sheet for semiconductor processing 1 according to the present embodiment, the energy ray curable antistatic polymer (B) contained in the pressure sensitive adhesive layer 3 has a salt (cation) thereby to prevent the generation of peeling charge at the time of peeling, such as pickup, and the chips can be collected without fracture of the circuits, chips and the like. Moreover, according to the feature that the energy ray curable antistatic polymer (B) contained in the pressure sensitive adhesive layer 3 has the energy ray curable group, contamination of the chips is unlikely to occur. The picked-up chips are delivered to the subsequent step such as a transportation step.

The embodiments heretofore explained are described to facilitate understanding of the present invention and are not described to limit the present invention. Therefore, it is intended that the elements disclosed in the above embodiments include all design changes and equivalents to fall within the technical scope of the present invention.

For example, another layer or layers may be interposed between the base material 2 and the pressure sensitive adhesive layer 3 in the above sheet for semiconductor processing 1.

EXAMPLES

Hereinafter, the present invention will be described further specifically with reference to examples, etc., but the scope of the present invention is not limited to these examples, etc.

Example 1

(1) Preparation of Acrylic-Based Polymer

An acrylic-based polymer (A1) was prepared by copolymerizing 90 mass parts of n-butyl acrylate and 10 mass parts of acrylic acid. The molecular weight of this acrylic-based polymer (A1) was measured using a method to be described later, and the weight-average molecular weight was 600,000. The obtained acrylic-based polymer (A1) was diluted to a solid content concentration of 34 mass % using a mixed solvent of toluene and ethyl acetate.

(2) Preparation of Energy Ray Curable Antistatic Polymer (B)

Copolymerization was performed using 45 mass parts of [2-(methacryloyloxy)ethyl]trimethyl ammonium bis(trifluoromethylsulfonyl)imide as a quaternary ammonium salt monomer (B1), 5 mass parts of methacrylic acid as a reactive functional group-containing monomer (B2), and 38 mass parts of 2-ethylhexyl acrylate and 5 mass parts of 2-hydroxyethyl acrylate as polymerizable monomers (B3).

The obtained polymer was reacted with 7 mass parts of glycidyl methacrylate as a curable group-containing compound (B4), and an energy ray curable antistatic polymer (B) (having a methacryloyl group and quaternary ammonium salt at a side chain) was obtained. The molecular weight of this energy ray curable antistatic polymer (B) was measured using a method to be described later, and the weight-average molecular weight was 30,000.

(3) Preparation of Sheet for Semiconductor Processing

A coating solution of a pressure sensitive adhesive composition was obtained through: mixing 100 mass parts (in terms of solid content, here and hereinafter) of the acrylic-based polymer (A1) obtained in the above step (1), 25 mass parts of hexafunctional urethane acrylate (weight-average molecular weight: 2,000) as an energy ray curable compound (A2), 25 mass parts of the energy ray curable antistatic polymer (B) as obtained in the above step (2), 0.3 mass parts of 1-hydroxycyclohexyl phenyl ketone (product name "IRGACURE 184" available from BASF SE) as a photopolymerization initiator, and 0.05 mass parts of 1,3-bis(N, N'-diglycidylaminomethyl)cyclohexane (product name "TETRAD-C" available from MITSUBISHI GAS CHEMICAL COMPANY, INC.) as a cross-linker (C); sufficiently stirring the mixture; and diluting the mixture with methyl ethyl ketone.

A release sheet (product name "SP-PET381031" available from LINTEC Corporation, thickness: 38 μm) was prepared by subjecting one surface of a polyethylene terephthalate film to release treatment with a silicone-based release agent, and the coating solution of the pressure sensitive adhesive composition obtained as the above was applied to the release treatment surface of the release sheet using a knife coater so that the thickness after drying would be 10 μm, and thereafter processed under 80° C. for 1 minute to form a coating film of the pressure sensitive adhesive composition. Subsequently, the obtained coating film and an ethylene-methacrylic acid copolymer (EMAA) film (thickness: 80 μm) as a base material were attached to each other, and a sheet for semiconductor processing was thereby obtained in a state in which the release sheet was laminated on the surface of the pressure sensitive adhesive layer opposite to the surface at the side of the base material.

Example 2

A sheet for semiconductor processing was manufactured in the same manner as in Example 1 except that the compounding amount of the energy ray curable antistatic polymer (B) was 1.5 mass parts in the above step (3).

Example 3

A sheet for semiconductor processing was manufactured in the same manner as in Example 1 except that the compounding amount of the energy ray curable antistatic polymer (B) was 100 mass parts in the above step (3).

Example 4

A sheet for semiconductor processing was manufactured in the same manner as in Example 1 except that the compounding amount of the energy ray curable antistatic polymer (B) was 200 mass parts in the above step (3).

Example 5

In the above step (2), adjustment was performed such that the weight-average molecular weight of the energy ray curable antistatic polymer (B) would be 150,000. A sheet for semiconductor processing was manufactured in the same manner as in Example 1 except that this energy ray curable antistatic polymer (B) was used.

Example 6

In the above step (2), adjustment was performed such that the weight-average molecular weight of the energy ray curable antistatic polymer (B) would be 3,000. A sheet for semiconductor processing was manufactured in the same manner as in Example 1 except that this energy ray curable antistatic polymer (B) was used.

Example 7

In the above step (2), adjustment was performed such that the weight-average molecular weight of the energy ray curable antistatic polymer (B) would be 1,000. A sheet for semiconductor processing was manufactured in the same manner as in Example 1 except that this energy ray curable antistatic polymer (B) was used.

Example 8

A sheet for semiconductor processing was manufactured in the same manner as in Example 1 except that 95 mass parts of n-butyl acrylate and 5 mass parts of acrylic acid were copolymerized in the above step (1).

Example 9

A sheet for semiconductor processing was manufactured in the same manner as in Example 1 except that 90 mass parts of n-butyl acrylate and 10 mass parts of 2-hydroxyethyl acrylate were copolymerized in the above step (1) and 0.2 mass parts of an isocyanate-based cross-linker (product name "BHS 8515" available from TOYOCHEM CO., LTD.) were used as the cross-linker (C) in the above step (3).

Example 10

A copolymer was obtained by copolymerizing 40 mass parts of 2-ethylhexyl acrylate, 40 mass parts of ethyl acetate, and 20 mass parts of 2-hydroxyethyl acrylate. This copolymer was reacted with 2-isocyanate ethyl methacrylate so that its molar equivalent to the hydroxy group of the 2-hydroxyethyl acrylate would be 80%, and an acrylic-based polymer (A3) was obtained, having a side chain to which an energy ray curable group was introduced (weight-average molecular weight: 600,000).

A coating solution of a pressure sensitive adhesive composition was obtained through: mixing 100 mass parts of the acrylic-based polymer (A3) having a side chain to which an energy ray curable group was introduced, 25 mass parts of the energy ray curable antistatic polymer (B) as obtained in the above step (2), 0.3 mass parts of 1-hydroxycyclohexyl phenyl ketone (product name "IRGACURE 184" available from BASF SE) as a photopolymerization initiator, and 0.05 mass parts of 1,3-bis(N,N'-diglycidylaminomethyl)cyclohexane (product name "TETRAD-C" available from MITSUBISHI GAS CHEMICAL COMPANY, INC.) as a cross-linker (C); sufficiently stirring the mixture; and diluting the mixture with methyl ethyl ketone. This coating solution was used to manufacture a sheet for semiconductor processing in the same manner as in Example 1.

Example 11

A sheet for semiconductor processing was manufactured in the same manner as in Example 1 except that a mixture of trifunctional urethane acrylate and tetrafunctional urethane acrylate (weight-average molecular weight: 5,000) was used as the energy ray curable compound (A2) in the above step (3).

Example 12

An acrylic-based polymer (A1) was prepared by copolymerizing 55 mass parts of 2-ethylhexyl acrylate, 30 mass parts of methoxypolyethylene glycol acrylate (product name "MPE400A" available from Osaka Organic Chemical Industry Ltd.), and 15 mass parts of hydroxyethyl acrylate. The molecular weight of this acrylic-based polymer (A1) was measured using a method to be described later, and the weight-average molecular weight was 600,000.

A coating solution of a pressure sensitive adhesive composition was obtained through: mixing 100 mass parts of the above acrylic-based polymer (A1), 50 mass parts of hexafunctional urethane acrylate (weight-average molecular weight: 2,000) as an energy ray curable compound (A2), 14 mass parts of the energy ray curable antistatic polymer (B) as obtained in the step (2) of Example 1, 0.3 mass parts of 1-hydroxycyclohexyl phenyl ketone (product name "IRGACURE 184" available from BASF SE) as a photopolymerization initiator, and 1.2 mass parts of an isocyanate-based cross-linker (product name "BHS 8515" available from TOYOCHEM CO., LTD.) as a cross-linker (C); sufficiently stirring the mixture; and diluting the mixture with methyl ethyl ketone. This coating solution was used to manufacture a sheet for semiconductor processing in the same manner as in Example 1.

Example 13

An acrylic-based polymer (A1) was prepared by copolymerizing 25 mass parts of 2-ethylhexyl acrylate, 60 mass parts of ethoxyethoxyethyl acrylate, and 15 mass parts of hydroxyethyl acrylate. The molecular weight of this acrylic-based polymer (A1) was measured using a method to be described later, and the weight-average molecular weight was 600,000.

A sheet for semiconductor processing was manufactured in the same manner as in Example 12 except that the above acrylic-based polymer (A1) was used as the acrylic-based polymer (A1).

Example 14

An acrylic-based polymer (A1) was prepared by copolymerizing 25 mass parts of 2-ethylhexyl acrylate, 60 mass parts of methoxyethyl acrylate, and 15 mass parts of hydroxyethyl acrylate. The molecular weight of this acrylic-based polymer (A1) was measured using a method to be described later, and the weight-average molecular weight was 600,000.

A sheet for semiconductor processing was manufactured in the same manner as in Example 12 except that the above acrylic-based polymer (A1) was used as the acrylic-based polymer (A1).

Comparative Example 1

A sheet for semiconductor processing was manufactured in the same manner as in Example 1 except that the glycidyl methacrylate was not reacted in the above step (2).

Here, the previously-described weight-average molecular weight (Mw) is a polystyrene equivalent weight-average molecular weight measured using the gel permeation chromatography (GPC) (GPC measurement).

«Exemplary Test 1» (Measurement of Surface Resistivity)

The sheet for semiconductor processing manufactured in each of the examples and comparative example was cut into 100 mm×100 mm, which was used as a sample. For the sample, after humidity conditioning was performed under 23° C. and a relative humidity of 50% for 24 hours, the release sheet was removed, and the surface resistivity of the pressure sensitive adhesive surface was measured at an applied voltage of 100 V using DIGITAL ELECTROMETER (available from ADVANTEST CORPORATION). Results are listed in Table 1.

«Exemplary Test 2» (Evaluation of Wafer Contamination)

The release sheet was removed from the sheet for semiconductor processing manufactured in each of the examples and comparative example, and the pressure sensitive adhesive layer was attached to and laminated on a silicon wafer by reciprocating once a roller of 5 kg to apply a load. After stationarily placing this under 23° C. and 50% RH for 24 hours, ultraviolet (UV) ray irradiation (illuminance: 230 mW/cm$^2$, light amount: 190 mJ/cm$^2$) was performed from the side of the base material of the sheet for semiconductor processing. The sheet for semiconductor processing was peeled off from a laminate of the sheet for semiconductor processing and silicon wafer after the ultraviolet ray irradiation at a peel speed of 300 mm/min and a peel angle of 180°, and thereafter the number of residual substances (particles) of the maximum diameter of 0.27 μm or more on the silicon wafer was measured using a wafer surface tester (product name "S6600" available from HITACHI Engineering Co., Ltd.). Results are listed in Table 1.

«Exemplary Test 3» (Evaluation of Chipping)

The release sheet was removed from the sheet for semiconductor processing manufactured in each of the examples and comparative example, and a 6-inch silicon wafer and a ring frame for dicing were attached to the exposed pressure sensitive adhesive layer using a tape mounter (product name "Adwill RAD-2500m/12" available from LINTEC Corporation). Subsequently, after the sheet for semiconductor processing was cut to correspond to the outer diameter of the ring frame, dicing of cutting from the side of the silicon wafer was performed under the condition below using a dicing apparatus (DFD-651 available from DISCO Corporation), and chips of 8 mm square were obtained.

<Dicing Condition>

Thickness of wafer: 350 μm

Dicing apparatus: DFD-651 available from DISCO Corporation

Blade: NBC-2H 2050 27HECC available from DISCO Corporation

Width of blade: 0.025 to 0.030 mm

Protruding amount of blade edge: 0.640 to 0.760 mm

Rotation speed of blade: 30,000 rpm

Cutting rate: 80 mm/sec

Depth of cutting into base material: 20 μm

Cutting water amount: 1.0 L/min

Cutting water temperature: 20° C.

Among the obtained chips of 8 mm square, chips located in the vicinity of the center portion of the sheet for semiconductor processing were used to observe whether chipping (cracks of chip end portions) was present or absent. More specifically, chips within an area defined by 50 chips in the base material MD direction and 50 chips in the base material CD direction were observed using an electron microscope (product name "VHZ-100" available from KEYENCE CORPORATION, magnification: ×300). Cracks having a width or depth of 20 μm or more were determined as chipping, and the number thereof was counted. Results are listed in Table 1.

TABLE 1

|  | Surface resistivity [Ω/□] | Particles [number] | Chipping [locations] |
| --- | --- | --- | --- |
| Example 1 | $1.7 \times 10^{11}$ | 2 | 3 |
| Example 2 | $1.2 \times 10^{12}$ | 4 | 1 |
| Example 3 | $5.1 \times 10^{10}$ | 18 | 16 |
| Example 4 | $1.5 \times 10^{10}$ | 74 | 49 |
| Example 5 | $7.3 \times 10^{11}$ | 12 | 1 |
| Example 6 | $9.8 \times 10^{10}$ | 54 | 5 |
| Example 7 | $8.1 \times 10^{10}$ | 128 | 8 |
| Example 8 | $1.6 \times 10^{11}$ | 17 | 4 |
| Example 9 | $5.6 \times 10^{11}$ | 5 | 6 |
| Example 10 | $7.1 \times 10^{11}$ | 10 | 2 |
| Example 11 | $7.1 \times 10^{11}$ | 18 | 5 |
| Example 12 | $6.8 \times 10^{9}$ | 14 | 7 |
| Example 13 | $1.4 \times 10^{10}$ | 15 | 6 |
| Example 14 | $3.1 \times 10^{10}$ | 11 | 7 |
| Comparative Example 1 | $3.5 \times 10^{11}$ | 1546 | 9 |

As apparent from Table 1, each of the sheets for semiconductor processing of the examples has sufficiently small surface resistivity, which exhibits an excellent antistatic property, and also has a small number of particles on the wafer, which means suppressed contamination. Moreover, the occurrence of chippings is suppressed by reducing the compounding amount of the energy ray curable antistatic polymer (B).

INDUSTRIAL APPLICABILITY

The sheet for semiconductor processing according to the present invention can be suitably used in a manufacturing process for semiconductor wafers and chips in which the peeling charge can be problematic.

DESCRIPTION OF REFERENCE NUMERALS

1 . . . Sheet for semiconductor processing
2 . . . Base material
3 . . . Pressure sensitive adhesive layer

The invention claimed is:

1. A semiconductor processing sheet, the sheet comprising a base material and a pressure sensitive adhesive layer laminated on at least one surface of the base material,
  the pressure sensitive adhesive layer being formed of a pressure sensitive adhesive composition, the pressure sensitive adhesive composition containing a polymer having an effective amount of a salt to provide antistatic properties during semiconductor processing and an energy ray curable group, and an energy ray curable pressure sensitive adhesive component excluding the polymer,
  a content of the polymer in the pressure sensitive adhesive composition being 0.5 to 30 mass %, and
  a weight-average molecular weight of the polymer being 30,000 to 200,000.

2. The semiconductor processing sheet as recited in claim 1, wherein the polymer has a (meth) acryloyl group as the energy ray curable group.

3. The semiconductor processing sheet as recited in claim 1, wherein a content of the energy ray curable group per a unit mass of the polymer is $5 \times 10^{-5}$ to $2 \times 10^{-3}$ mol/g.

4. The semiconductor processing sheet as recited in claim 1, wherein the energy ray curable pressure sensitive adhesive component contains an acrylic-based polymer without energy ray curability and an energy ray curable compound.

5. The semiconductor processing sheet as recited in claim 1, wherein the energy ray curable pressure sensitive adhesive component contains an acrylic-based polymer having a side chain to which an energy ray curable group is introduced.

6. The semiconductor processing sheet as recited in claim 1, wherein the energy ray curable pressure sensitive adhesive component contains a cross-linker.

7. The semiconductor processing sheet as recited in claim 1, wherein the salt is a quaternary ammonium salt.

8. The semiconductor processing sheet as recited in claim 4, wherein the acrylic-based polymer has an ether bond at a side chain.

9. The semiconductor processing sheet as recited in claim 1, wherein the polymer has an effective amount of a salt to provide antistatic properties during peeling.

* * * * *